United States Patent
Igarashi et al.

(10) Patent No.: US 10,297,562 B2
(45) Date of Patent: May 21, 2019

(54) SEMICONDUCTOR DEVICE AND METHOD OF MANUFACTURING A SEMICONDUCTOR DEVICE

(71) Applicant: ABLIC Inc., Chiba-shi, Chiba (JP)

(72) Inventors: Kaku Igarashi, Chiba (JP); Shinjiro Kato, Chiba (JP); Hisashi Hasegawa, Chiba (JP); Masaru Akino, Chiba (JP); Yukihiro Imura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/915,992

(22) Filed: Mar. 8, 2018

(65) Prior Publication Data

US 2018/0269170 A1 Sep. 20, 2018

(30) Foreign Application Priority Data

Mar. 14, 2017 (JP) ................. 2017-048800

(51) Int. Cl.
*H01L 23/48* (2006.01)
*H01L 23/00* (2006.01)
(Continued)

(52) U.S. Cl.
CPC ........ *H01L 24/05* (2013.01); *H01L 21/02107* (2013.01); *H01L 24/03* (2013.01); *H01L 23/3192* (2013.01); *H01L 23/562* (2013.01); *H01L 2224/0226* (2013.01); *H01L 2224/02123* (2013.01); *H01L 2224/02251* (2013.01); *H01L 2224/02255* (2013.01); *H01L 2224/03011* (2013.01); *H01L 2224/03019* (2013.01); *H01L 2224/0362* (2013.01); *H01L 2224/0391* (2013.01); *H01L 2224/03614* (2013.01); *H01L 2224/03826* (2013.01); *H01L 2224/04042* (2013.01); *H01L 2224/05008* (2013.01); *H01L 2224/05124* (2013.01);
(Continued)

(58) Field of Classification Search
CPC .................. H01L 23/564; H01L 24/05; H01L 2224/02251; H01L 2224/0226; H01L 2924/04941
USPC ................................ 257/751, 765, 767, 770
See application file for complete search history.

(56) References Cited

U.S. PATENT DOCUMENTS

| 5,869,901 A * | 2/1999 | Kusuyama | ........ H01L 21/32051 257/763 |
| 8,373,270 B2 * | 2/2013 | Homma | .................. H01L 22/32 257/750 |
| 8,872,341 B2 * | 10/2014 | Dallmann | ......... H01L 21/76843 257/751 |

(Continued)

FOREIGN PATENT DOCUMENTS

JP 5443827 B2 3/2014

*Primary Examiner* — Nitin Parekh
(74) *Attorney, Agent, or Firm* — Brinks Gilson & Lione

(57) ABSTRACT

Provided is a semiconductor device that is resistant to the corrosion of titanium nitride forming an anti-reflection film. The semiconductor device includes: a wiring layer which includes a wiring film made of aluminum or an aluminum alloy and formed on a substrate and a titanium nitride film formed on the wiring film; a protection layer which covers a top surface and a side surface of the wiring layer; and a pad portion which penetrates the protection layer and the titanium nitride film, and which exposes the wiring film, the protection layer including a first silicon nitride film, an oxide film, and a second silicon nitride film which are layered in the stated order from the side of the wiring layer.

4 Claims, 3 Drawing Sheets

(51) Int. Cl.
    *H01L 21/02*    (2006.01)
    *H01L 23/31*    (2006.01)
(52) U.S. Cl.
    CPC ............ *H01L 2224/05624* (2013.01); *H01L 2224/45139* (2013.01); *H01L 2224/45144* (2013.01); *H01L 2224/45147* (2013.01); *H01L 2224/85205* (2013.01); *H01L 2224/85375* (2013.01); *H01L 2924/04941* (2013.01); *H01L 2924/05042* (2013.01); *H01L 2924/05442* (2013.01); *H01L 2924/3512* (2013.01)

(56)         References Cited
         U.S. PATENT DOCUMENTS

| | | | |
|---|---|---|---|
| 2002/0163083 A1* | 11/2002 | Hatano | H01L 23/53223 257/762 |
| 2004/0150112 A1* | 8/2004 | Oda | H01L 23/53238 257/758 |
| 2006/0249845 A1* | 11/2006 | Takai | H01L 23/3192 257/750 |
| 2007/0037379 A1* | 2/2007 | Enquist | H01L 21/76898 438/618 |
| 2008/0088023 A1* | 4/2008 | Oda | H01L 23/53238 257/751 |
| 2008/0290516 A1* | 11/2008 | Oda | H01L 23/53238 257/751 |
| 2010/0295044 A1 | 11/2010 | Homma et al. | |
| 2011/0209899 A1* | 9/2011 | Hill | H05K 3/4007 174/126.1 |
| 2012/0292730 A1* | 11/2012 | Tsai | H01L 23/5226 257/443 |
| 2016/0379946 A1* | 12/2016 | Maekawa | H01L 24/06 257/773 |

* cited by examiner

SEMICONDUCTOR DEVICE AND METHOD OF MANUFACTURING A SEMICONDUCTOR DEVICE

RELATED APPLICATIONS

This application claims priority under 35 U.S.C. § 119 to Japanese Patent Application No. 2017-048800 filed on Mar. 14, 2017, the entire content of which is hereby incorporated by reference.

BACKGROUND OF THE INVENTION

1. Field of the Invention

The present invention relates to a semiconductor device and a method of manufacturing a semiconductor device.

2. Description of the Related Art

An existing semiconductor device includes a wiring made of aluminum or an aluminum alloy and formed on a substrate, an anti-reflection film made of titanium nitride and formed on the wiring, and an oxide film formed on the anti-reflection film, and a pad portion which exposes the wiring is formed at a place where an opening portion formed in the oxide film and an opening portion formed in the anti-reflection film overlap with each other in plan view.

In a semiconductor device of having such a structure, titanium nitride forming the anti-reflection film is sometimes corroded in a portion surrounding the opening portion by a long-term reliability test that involves bias application under a high-temperature and high-humidity environment, abbreviated as THB (Temperature Humidity Bias).

To solve this problem, a semiconductor device has been proposed in which titanium nitride forming the anti-reflection film is not exposed in the opening portion.

For example, in Japanese Patent No. 5443827, there is proposed a semiconductor device including: a first surface protection film with a first opening portion formed above a pad; and a second surface protection film formed on the pad and the first surface protection film to have a second opening portion above the pad, in which the pad includes a first conductor film and an anti-reflection film formed on the first conductor film, the second opening portion is contained in an inner region of the first opening portion, and the anti-reflection film is removed from the inner region of the first opening portion.

However, in the method described in Japanese Patent No. 5443827, it is required to perform a photolithography step twice to process the opening for exposing the pad, which increases the number of steps.

In addition, in a semiconductor device of the related art, particularly one in which a silicon oxide film is formed on an anti-reflection film made of titanium nitride, and the titanium nitride and the silicon oxide film are exposed in an opening portion for exposing a pad, the anti-reflection film may change into titanium oxide due to the long-term reliability test with bias under a high-temperature and high-humidity environment (THB), resulting in a possible impairment of the external appearance.

SUMMARY OF THE INVENTION

The present invention provides a semiconductor device in which an anti-reflection film made of titanium nitride is resistant to corrosion despite the presence of a silicon oxide film formed on the anti-reflection film made of titanium nitride, and an opening for a pad portion can be formed by performing a photolithography step once, and a method of manufacturing the semiconductor device.

Through extensive research, the inventors of the present invention have thought of a semiconductor device in which a protection layer covering top and side surfaces of a wiring layer which includes a wiring film and a titanium nitride film formed on the wiring film has a three-layer structure in which an oxide film is sandwiched between two silicon nitride films, which leads to the present invention.

Specifically, the present invention relates to the following items.

According to one embodiment of the present invention, there is provided a semiconductor device comprising:

a wiring layer having a wiring film formed on a substrate and a titanium nitride film formed on the wiring film;

a protection layer covering a top surface and a side surface of the wiring layer; and a pad portion penetrating the protection layer and the titanium nitride film, and exposing the wiring film, the protection layer including a first silicon nitride film, an oxide film, and a second silicon nitride film layered in the stated order from the wiring layer side.

According to one embodiment of the present invention, there is provided a method of manufacturing a semiconductor device including:

forming a wiring layer by forming, on a substrate, a wiring film and a titanium nitride film in the order stated, and then patterning the wiring film and the titanium nitride film;

forming a protection layer so as to cover a top surface and a side surface of the wiring layer, by forming a first silicon nitride film, an oxide film, and a second silicon nitride film in the order stated; and forming a pad portion which penetrates the protection layer and the titanium nitride film, and which exposes the wiring film, by etching the protection layer and the titanium nitride film.

According to the semiconductor device of the present invention, the top and side surfaces of the wiring layer which includes the wiring film and the titanium nitride film formed on the wiring film are covered with the protection layer in which the first silicon nitride film, the oxide film, and the second silicon nitride film are layered in the order stated. This makes the titanium nitride film serving as an anti-reflection film resistant to corrosion, thereby giving high reliability to the semiconductor device.

According to the semiconductor device of the present invention, an opening for the pad portion can be formed by performing a photolithography step once, which contributes to productivity of the semiconductor device.

DETAILED DESCRIPTION OF THE EMBODIMENTS

Figure 1:
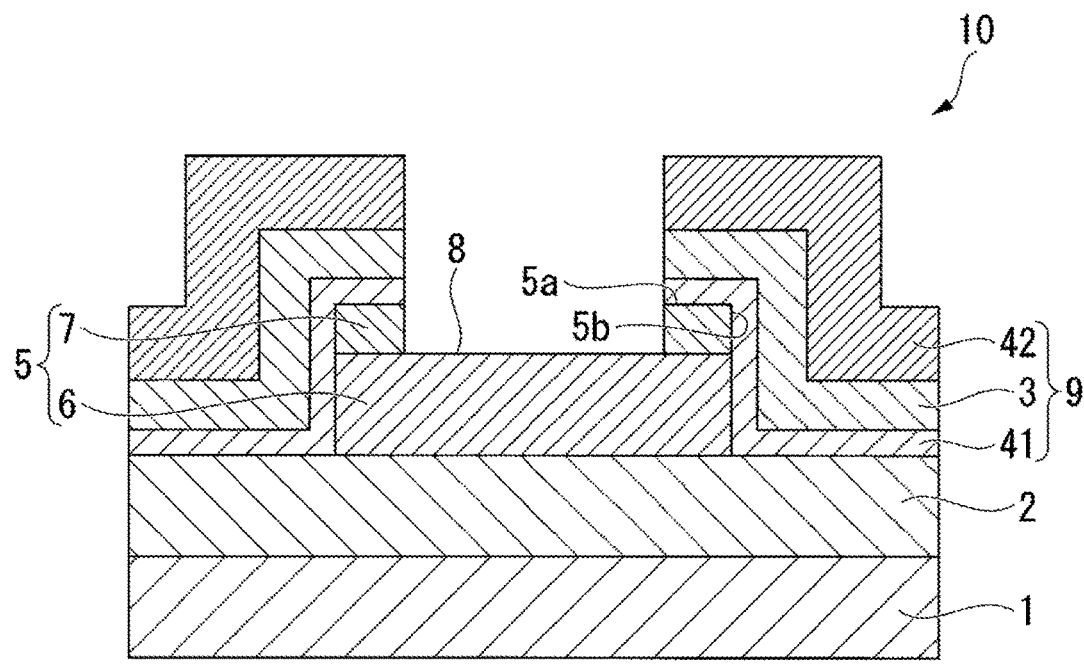
FIG. 1 is a schematic sectional view for illustrating an example of a semiconductor device according to the present invention.

The inventors of the present invention have acquired the following findings as a result of extensive research.

The inventors of the present invention have examined the corrosion of the titanium nitride film caused by a long-term reliability test with a bias under a high-temperature and high-humidity environment (THB) in a semiconductor device of the related art which includes an anti-reflection film made of titanium nitride. It has thus been found that a surface of the titanium nitride film which opposes the oxide film in the vicinity of the opening portion for exposing the pad portion is particularly liable to corrode when the titanium nitride film and an oxide film are formed on a wiring film in the stated order, and a pad portion which exposes the wiring film is formed at a place where an opening portion formed in the oxide film and an opening portion formed in the titanium nitride film overlap with each other in plan view.

It is presumed that the following reaction is the main cause of the corrosion in the surface of the titanium nitride film which opposes the oxide film formed thereon, in which the titanium nitride film serves as an anti-reflection film. Specifically, in the titanium nitride film, titanium atoms and nitrogen atoms do not form a stoichiometric composition, and titanium atoms have dangling bonds due to a shortage of nitrogen atoms. The dangling bonds of the titanium atoms react with moisture infiltrating from the outside through a part of the oxide film that is exposed in the opening portion for exposing the pad portion, thereby generating titanium oxide. The generated titanium oxide lowers the adhesion to the opposed surface and allows more moisture to infiltrate in the opposed surface, thus accelerating corrosion.

In view of this, the inventors of the present invention have studied to reduce the reaction between the titanium nitride film and moisture infiltrating from the outside, and have found that a silicon nitride film formed between the titanium nitride film and the oxide film is effective for the reduction. After a further study, the inventors of the present invention have contrived a method of forming a silicon nitride film on the oxide film in addition to forming the silicon nitride film between the titanium nitride film and the oxide film, in order to give sufficient reliability to the semiconductor device.

In the semiconductor device structured as this, nitrogen atoms are supplied to the titanium nitride film from the silicon nitride film formed so as to be in contact with the titanium nitride film. Titan atoms in the titanium nitride film and nitrogen atoms in the silicon nitride film accordingly react with each other to hinder the reaction between titanium atoms in the titanium nitride film and oxygen atoms in moisture. In addition, since the silicon nitride film has fine water resistance, the corrosion of the titanium nitride film that is caused by moisture infiltrating from the outside is reduced even the thickness of the silicon nitride film formed on the oxide film is thin. For those reasons, the semiconductor device described above gives resistance to corrosion to the titanium nitride film, and accordingly has high reliability.

Another possible way to reduce the reaction between the titanium nitride film and moisture infiltrating from the outside is to form a protection layer formed from a silicon nitride film alone instead of the oxide film. However, a stress difference between the silicon nitride film and the wiring layer is larger than a stress difference between the oxide film and the wiring layer. The large stress difference between the silicon nitride film and the wiring layer causes a crack in the silicon nitride film when the protection layer formed from the silicon nitride film alone is thick enough, which impairs the reliability of the semiconductor device.

The present invention is described in detail below with reference to the drawings. Some of the drawings referred to in the following description are enlarged views of characteristic portions, which are enlarged for convenience of making the characteristics of the present invention understood easier, and the ratios of the dimensions of components to one another and the like may differ from actuality. The materials, dimensions, and the like given in the following description are an example, and the present invention is not limited thereto. The present invention can be carried out in suitably varied modes without losing the effects of the present invention.

[Semiconductor Device]

FIG. 1 is a schematic sectional view for illustrating an example of a semiconductor device according to the present invention.

A semiconductor device 10 of this embodiment includes a substrate 1, a wiring 5 which is formed above the substrate 1 with an interlayer insulating film 2 interposed between the two, and a protection layer 9 which covers a top surface 5a and a side surface 5b of the wiring layer 5.

The wiring layer 5 includes a wiring film 6, and a titanium nitride film 7 formed on the wiring film 6 as illustrated in FIG. 1.

The protection layer 9 is formed by, as illustrated in FIG. 1, layering a first silicon nitride film 41, an oxide film 3, and a second silicon nitride film 42 in the stated order from the side of the wiring layer 5.

The semiconductor device 10 of this embodiment includes a pad portion 8 which penetrates the protection layer 9 and the titanium nitride film 7 which is one of the films forming the wiring layer 5, and the pad portion 8 which exposes the wiring film 5.

End faces of the titanium nitride film 7, the first silicon nitride film 41, the oxide film 3, and the second silicon nitride film 42 are exposed from the side surface of the pad portion 8 in the stated order from the bottom. These end faces substantially form a plane and construct each of the side walls of the pad portion 8 which usually has four side walls.

A substrate made of silicon or other known materials can be used as the substrate 1.

The interlayer insulating film 2 can be a known insulating film, for example, a $SiO_2$ film, or an oxide film having tetraethyl orthosilicate (TEOS) ($Si(OC_2H_5)_4$) as a raw material.

The wiring film 6 is made of aluminum or an aluminum alloy.

Examples of the aluminum alloy used include an alloy of aluminum, silicon, and copper, an alloy of aluminum and copper, and an alloy of aluminum and silicon. A preferred thickness of the wiring film 6 is from 3,000 Å to 30,000 Å.

The titanium nitride film 7 is an anti-reflection film. A preferred thickness of the titanium nitride film 7 is from 250 Å to 800 Å.

The first silicon nitride film 41 is formed so as to be in contact with the titanium nitride film 7 which forms a top surface of the wiring layer 5, and so as to cover the top surface 5a and the side surface 5b of the wiring layer 5.

The first silicon nitride film 41 is preferred to be high in nitrogen content in order to supply nitrogen atoms efficiently to the titanium nitride film 7 which is arranged so as to be in contact with the first silicon nitride film 41. Specifically, a preferred nitrogen content in the first silicon nitride film 41 is 1.2 times higher than the silicon content or more in atomic composition ratio. The nitrogen content in the first silicon nitride film 41 can be measured by, for example, X-ray photoelectron spectroscopy (XPS). It is also preferred for the first silicon nitride film 41 to be higher in nitrogen content than the second silicon nitride film 42.

It is preferred for the first silicon nitride film 41 to have a thickness less than the thickness of the second silicon nitride film 42. When the first silicon nitride film 41 is less than the second silicon nitride film 42 in thickness, a stress difference between the wiring layer 5 and the protection layer 9 is smaller than when the first silicon nitride film 41 has a thickness equal to or larger than the thickness of the second silicon nitride film 42, and the chance of causing a crack in the protection layer 9 is accordingly low.

A preferred thickness of the first silicon nitride film 41 is from 100 Å to 1,000 Å. When the first silicon nitride film 41 has a thickness of 100 Å or more, the effect of preventing the corrosion of the titanium nitride film 7 is remarkable. The stress difference between the first silicon nitride film 41 and the titanium nitride film 7 is sufficiently small when the thickness of the first silicon nitride film 41 is 1,000 Å or less.

As described above, the first silicon nitride film 41 has water resistance, and the titanium nitride film 7 high in nitrogen content is further formed under the first silicon nitride film 41. The reaction between the titanium nitride film 7 and moisture infiltrating through the oxide film 3 on the first silicon nitride film 41 can consequently be prevented even the thickness of the first silicon nitride film 41 is thin, which gives high reliability to the semiconductor device 10.

The oxide film 3 is formed so as to cover the first silicon nitride film 41. A silicon oxide film is preferred as the oxide film 3. Specifically, a $SiO_2$ film, an oxide film having TEOS as a raw material, or a similar film can be used as the oxide film 3.

A preferred thickness of the oxide film 3 is from 2,000 Å to 8,000 Å, and a thickness of about 5,000 Å is even more preferred. The oxide film 3 that has a thickness of 2,000 Å or more has a remarkable effect on lessening the stress difference between the wiring layer 5 and the protection layer 9. The oxide film 3 having a thickness of 8,000 Å or less is favorable since the thickness of the oxide film 3 hardly affects the downsizing of the semiconductor device 10.

The second silicon nitride film 42 is formed so as to cover the oxide film 3.

A preferred thickness of the second silicon nitride film 42 is from 5,000 Å to 15,000 Å, and a thickness of about 10,000 Å is even more preferred. When the second silicon nitride film 42 has a thickness of 5,000 Å or more, the effect of preventing the corrosion of the titanium nitride film 7 that is caused by moisture infiltrating from the outside is remarkable. The second silicon nitride film 42 having a thickness of 15,000 Å or less is favorable since the chance of causing a crack from the stress difference between the second silicon nitride film 42 and the wiring layer 5 is small.

[Method of Manufacturing Semiconductor Device]

A method of manufacturing a semiconductor device according to the present invention is described next by taking as an example a method of manufacturing the semiconductor device of FIG. 1. FIGS. 2 to 6 are process views for illustrating an example of the method of manufacturing the semiconductor device of FIG. 1.

To manufacture the semiconductor device 10 illustrated in FIG. 1, the interlayer insulating film 2 is formed first on one of the principal surfaces of the substrate 1, and the wiring layer 5 which includes the wiring film 6 and the titanium nitride film 7 is formed.

Figure 2:
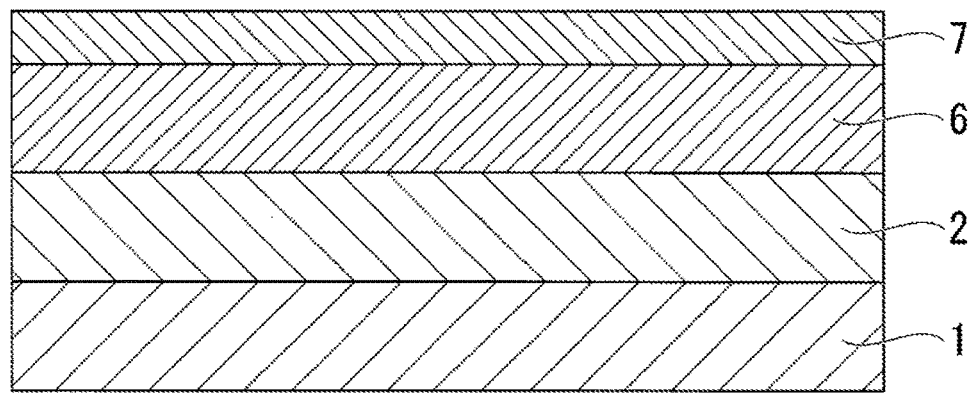
FIG. 2 is a process view for illustrating an example of a method of manufacturing the semiconductor device of FIG. 1.

Specifically, the interlayer insulating film 2 is formed on the substrate 1 as illustrated in FIG. 2 by chemical vapor deposition (CVD) or other methods. The wiring film 6 is then formed on the interlayer insulating film 2 by sputtering or other methods. The titanium nitride film 7 is formed next on the wiring film 6 by reactive sputtering that uses argon gas (Ar) and nitrogen gas ($N_2$).

Figure 3:
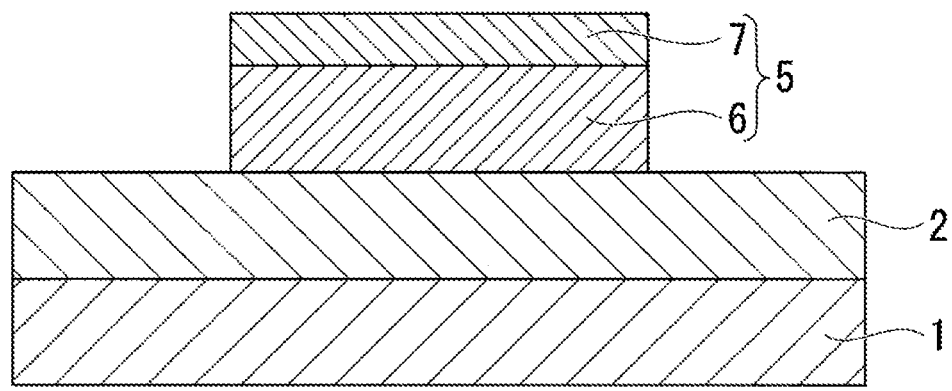
FIG. 3 is a process view for illustrating the example of the method of manufacturing the semiconductor device of FIG. 1.

Next, the wiring film 6 and the titanium nitride film 7 are patterned into a given shape as illustrated in FIG. 3 with the use of a known photolithography method and a known etching method. The wiring layer 5 which includes the wiring film 6 and the titanium nitride film 7 is thus formed (a wiring layer forming step).

Figure 4:
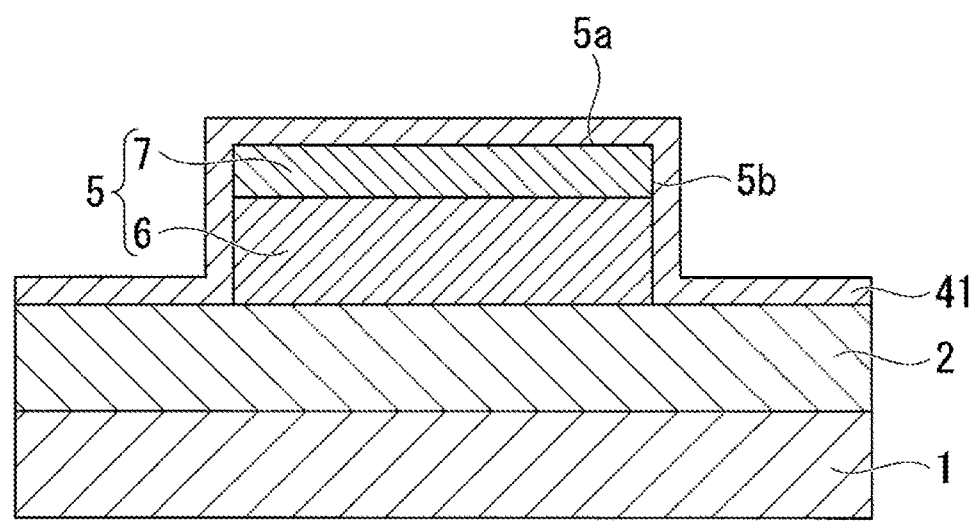
FIG. 4 is a process view for illustrating the example of the method of manufacturing the semiconductor device of FIG. 1.

Next, the first silicon nitride film 41 is formed so as to cover the top surface 5a and the side surface 5b of the wiring layer 5 as illustrated in FIG. 4 by plasma CVD or other methods.

It is preferred to give a high nitrogen content to the first silicon nitride film 41 by forming the first silicon nitride film 41 under a condition in which the flow rate of gas containing nitrogen ($N_2$ or $NH_3$) is set high in plasma CVD, in order to supply nitrogen atoms efficiently to the titanium nitride film 7 which is arranged so as to be in contact with the first silicon nitride film 41.

Figure 5:
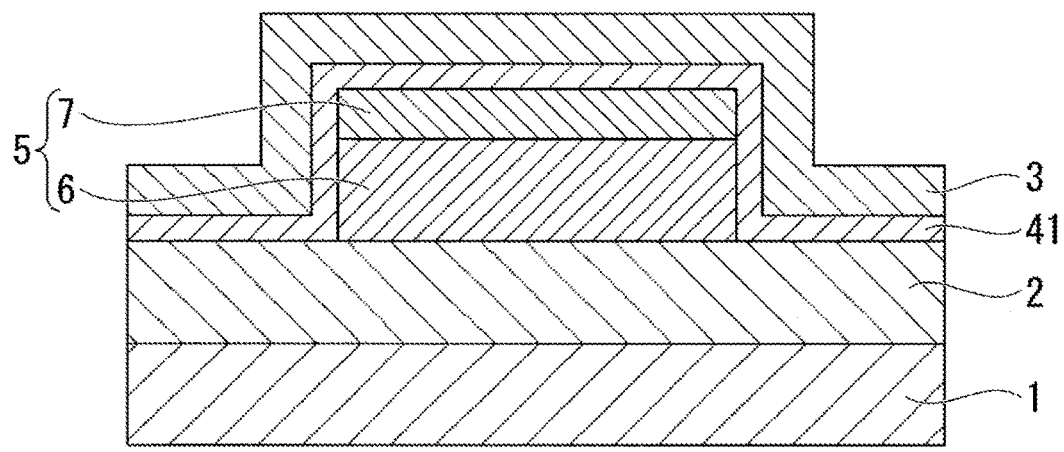
FIG. 5 is a process view for illustrating the example of the method of manufacturing the semiconductor device of FIG. 1.
Figure 6:
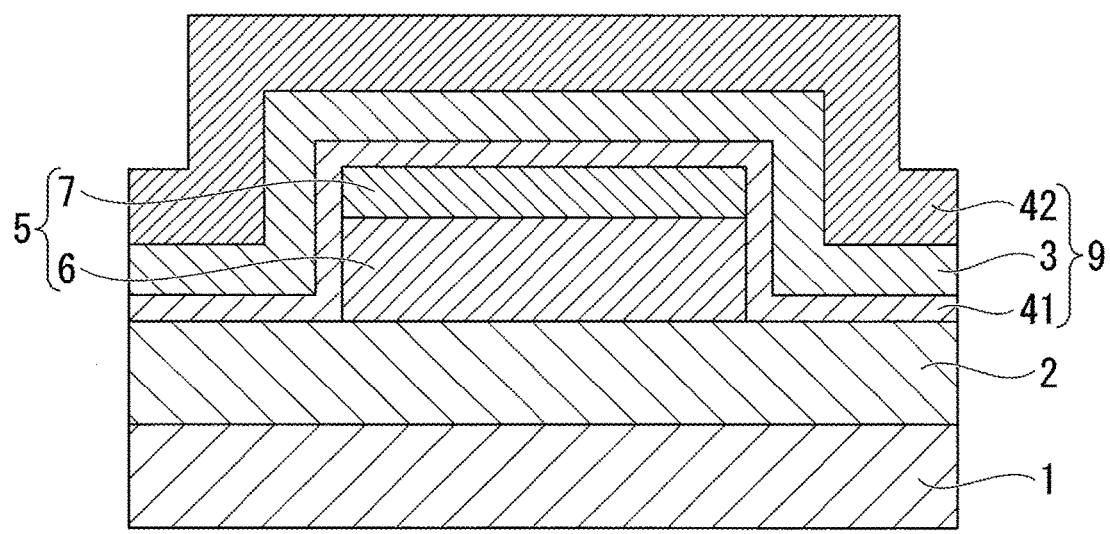
FIG. 6 is a process view for illustrating the example of the method of manufacturing the semiconductor device of FIG. 1.

Next, the oxide film 3 is formed on the first silicon nitride film 41 as illustrated in FIG. 5 by plasma CVD or other methods. The second silicon nitride film 42 is formed next on the oxide film 3 as illustrated in FIG. 6 by plasma CVD or other methods. The protection layer 9 in which the first silicon nitride film 41, the oxide film 3, and the second silicon nitride film 42 are layered in the stated order from the side of the wiring layer 5 is thus formed as illustrated in FIG. 6 (a protection layer forming step).

Next, the second silicon nitride film 42, the oxide film 3, the first silicon nitride film 41, and the titanium nitride film 7 are etched successively by a known photolithography method and a known etching method with the use of the same mask. The pad portion 8 which penetrates the protection layer 9 and the titanium nitride film 7 and exposes the wiring film 6 is thus formed as illustrated in FIG. 1 (a pad portion forming step).

In the pad portion forming step, etching gas used to etch the second silicon nitride film 42, the first silicon nitride film 41, and the titanium nitride film 7 can be $CF_4$ gas, for example.

Etching gas used to etch the oxide film 3 can be, for example, a mixed gas containing $CHF_3$, $CF_4$, and Ar.

Through the steps described above, the semiconductor device 10 illustrated in FIG. 1 is obtained.

In the semiconductor device 10 of this embodiment, the top surface 5a and the side surface 5b of the wiring layer 5 in which the titanium nitride film 7 is formed on the wiring film 6 is covered with the protection layer 9 in which the first silicon nitride film 41, the oxide film 3, and the second silicon nitride film 42 are layered in the stated order from the side of the wiring layer 5. This makes the titanium nitride film 7 serving as an anti-reflection film resistant to corrosion, thereby giving high reliability to the semiconductor device 10.

In the method of manufacturing the semiconductor device 10 of this embodiment, the second silicon nitride film 42, the oxide film 3, the first silicon nitride film 41, and the titanium nitride film 7 are etched successively with the use of the same mask in the pad portion forming step. Accordingly, the photolithography step and the etching step each need to be performed only once, and the number of masks required to create the pad portion is one as in a semiconductor device of the related art. Consequently the semiconductor device 10 can be manufactured efficiently in a shorter time and at a lower cost than in Japanese Patent No. 5443827 cited above.

The semiconductor device according to the present invention is not limited to the semiconductor device 10 of the embodiment described above.

For instance, the description given above on the embodiment takes as an example a case in which the semiconductor device 10 has one wiring layer 5 including the wiring film 6 and the titanium nitride film 7. However, the semiconductor device 10 may have a multi-layer wiring structure made of known materials that has the wiring layer 5 described above as the topmost layer.

The semiconductor device according to the present invention may further include layers having various functions to suit its use.

What is claimed is:

1. A semiconductor device, comprising:
   a wiring layer having a wiring film on a substrate and a titanium nitride film on the wiring film;
   a protection layer covering a top surface and a side surface of the wiring layer; and
   a pad portion penetrating the protection layer and the titanium nitride film, and exposing the wiring film, the protection layer including a first silicon nitride film, an oxide film, and a second silicon nitride film in sequence on a side of the wiring layer,
   and end surfaces of the first silicon nitride film, the oxide film, and the second silicon nitride film are exposed in the pad portion and define a side surface of the pad portion.

2. The semiconductor device according to claim 1, wherein the first silicon nitride film has a thickness of from 100 Å to 1,000 Å.

3. A method of manufacturing a semiconductor device, comprising:
   forming a wiring layer on a substrate, the wiring layer including a wiring film and a titanium nitride film in sequence;
   patterning the wiring film and the titanium nitride film;
   forming a protection layer so as to cover a top surface and a side surface of the wiring layer, the protection layer including a first silicon nitride film, an oxide film, and a second silicon nitride film in sequence; and
   etching portions of the protection layer and the titanium nitride film to form a pad portion that penetrates the protection layer and the titanium nitride film, and exposes the wiring film and end surfaces of the first silicon nitride film, the oxide film, and the second silicon nitride film to define a side surface of the pad portion.

4. The method of manufacturing a semiconductor device according to claim 3, wherein forming the protection layer comprises forming the first silicon nitride film having a thickness of from 100 Å to 1,000 Å.

* * * * *